(12) United States Patent
Hsu et al.

(10) Patent No.: US 12,087,647 B2
(45) Date of Patent: *Sep. 10, 2024

(54) COMPOUND CLOSED-TYPE METAL LID FOR SEMICONDUCTOR CHIP PACKAGE

(71) Applicant: HOJET TECHNOLOGY CO., LTD., New Taipei (TW)

(72) Inventors: Ying-Lin Hsu, New Taipei (TW); Juei-An Lo, Taoyuan (TW)

(73) Assignee: HOJET TECHNOLOGY CO., LTD., New Taipei (TW)

( * ) Notice: Subject to any disclaimer, the term of this patent is extended or adjusted under 35 U.S.C. 154(b) by 329 days.

This patent is subject to a terminal disclaimer.

(21) Appl. No.: 17/675,022

(22) Filed: Feb. 18, 2022

(65) Prior Publication Data

US 2023/0062721 A1 Mar. 2, 2023

(30) Foreign Application Priority Data

Sep. 1, 2021 (TW) ................................ 110132384

(51) Int. Cl.
*H01L 23/04* (2006.01)
*H01L 23/00* (2006.01)
*H01L 23/06* (2006.01)
*H01L 23/367* (2006.01)

(52) U.S. Cl.
CPC .............. *H01L 23/04* (2013.01); *H01L 23/06* (2013.01); *H01L 23/367* (2013.01); *H01L 23/562* (2013.01)

(58) Field of Classification Search
None
See application file for complete search history.

(56) References Cited

U.S. PATENT DOCUMENTS

| | | | | |
|---|---|---|---|---|
| 5,278,447 A | * | 1/1994 | Vongfuangfoo | ...... H01L 23/562 257/727 |
| 7,002,803 B2 | | 2/2006 | Kurihara et al. | |
| 10,074,757 B2 | | 9/2018 | Hokari | |
| 2003/0164549 A1 | * | 9/2003 | Nakayama | .......... H01L 23/3128 257/E23.101 |
| 2006/0202326 A1 | | 9/2006 | Huang et al. | |
| 2006/0278974 A1 | | 12/2006 | Hsiao et al. | |
| 2020/0350231 A1 | | 11/2020 | Shen | |

FOREIGN PATENT DOCUMENTS

| | | |
|---|---|---|
| TW | 570307 U | 1/2004 |
| TW | 594956 B | 6/2004 |
| TW | I269419 B | 12/2006 |

* cited by examiner

*Primary Examiner* — Bo B Jang
(74) *Attorney, Agent, or Firm* — Li & Cai Intellectual Property (USA) Office

(57) ABSTRACT

A compound closed-type metal lid for a semiconductor chip package is provided. The compound closed-type metal lid includes a cover plate, and a frame bottom board. The cover plate has a frame body, and a plurality of riveting holes. The riveting holes penetrate through the frame body and are distributed symmetrically on the frame body. The frame bottom board has a frame body, a plurality of riveting protrusions, and an opening. The riveting protrusions are distributed on an upper surface of the frame body. The cover plate is disposed on an upper surface of the frame bottom board. The riveting protrusions are correspondingly riveted in the riveting holes.

7 Claims, 5 Drawing Sheets

COMPOUND CLOSED-TYPE METAL LID FOR SEMICONDUCTOR CHIP PACKAGE

CROSS-REFERENCE TO RELATED PATENT APPLICATION

This application claims the benefit of priority to Taiwan Patent Application No. 110132384, filed on Sep. 1, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a compound closed-type metal lid for a semiconductor chip package, and more particularly to a compound metal lid that is a combination of two metal plates of different or the same materials, and is configured to be disposed on a substrate of a semiconductor chip package.

BACKGROUND OF THE DISCLOSURE

When the production of a wafer is finished, the wafer usually is sliced up into many pieces of dies, such as processor cores. Next, the die is mounted on a semiconducting substrate. The substrate can be regarded as a smaller and more precise printed circuit board. The die usually is mounted onto the substrate using a flip-chip package technology. To prevent the substrate from warping in subsequent processes and to enhance the heat-dissipation function of the die, a top cover is usually disposed on the substrate, which is also called integrated heat spreader (IHS).

However, as the size of the chip becomes bigger, the size of the substrate also becomes larger. On the other hand, certain top covers are in a shape of a square frame, so that a top surface of the die is directly exposed.

Therefore, it has become an issue to be addressed in the art for increasing the structural strength of a compound metal lid for a semiconductor chip package through an improved structural design, to prevent the substrate from warping.

SUMMARY OF THE DISCLOSURE

In response to the above-referenced technical inadequacy, the present disclosure provides a compound closed-type metal lid for a semiconductor chip package, which can be applied to a larger-sized semiconductor chip and a substrate thereof, so as to increase the overall structural strength of the substrate and prevent the substrate from warping.

In one aspect, the present disclosure provides a compound closed-type metal lid for a semiconductor chip package, which includes a cover plate and a frame bottom board. The cover plate includes a plate body, and a plurality of riveting holes. The riveting holes penetrate through the plate body and are symmetrically distributed on the plate body. The frame bottom board includes a frame body, a plurality of riveting protrusions, and an opening. The riveting protrusions are distributed on an upper surface of the frame body. The cover plate is disposed on an upper surface of the frame bottom board, and the plurality of the riveting protrusions are correspondingly riveted in the plurality of the riveting holes.

Therefore, in the compound closed-type metal lid provided by the present disclosure, by virtue of "the cover plate disposed on the upper surface of the frame bottom board" and "the riveting protrusions correspondingly riveted in the riveting holes," the compound closed-type metal lid can be applied to a large-sized semiconductor chip and the substrate, so as to increase the overall structural strength of the substrate, prevent the warping issue from occurring on the substrate, and enhance the heat-dissipation function of the semiconductor chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
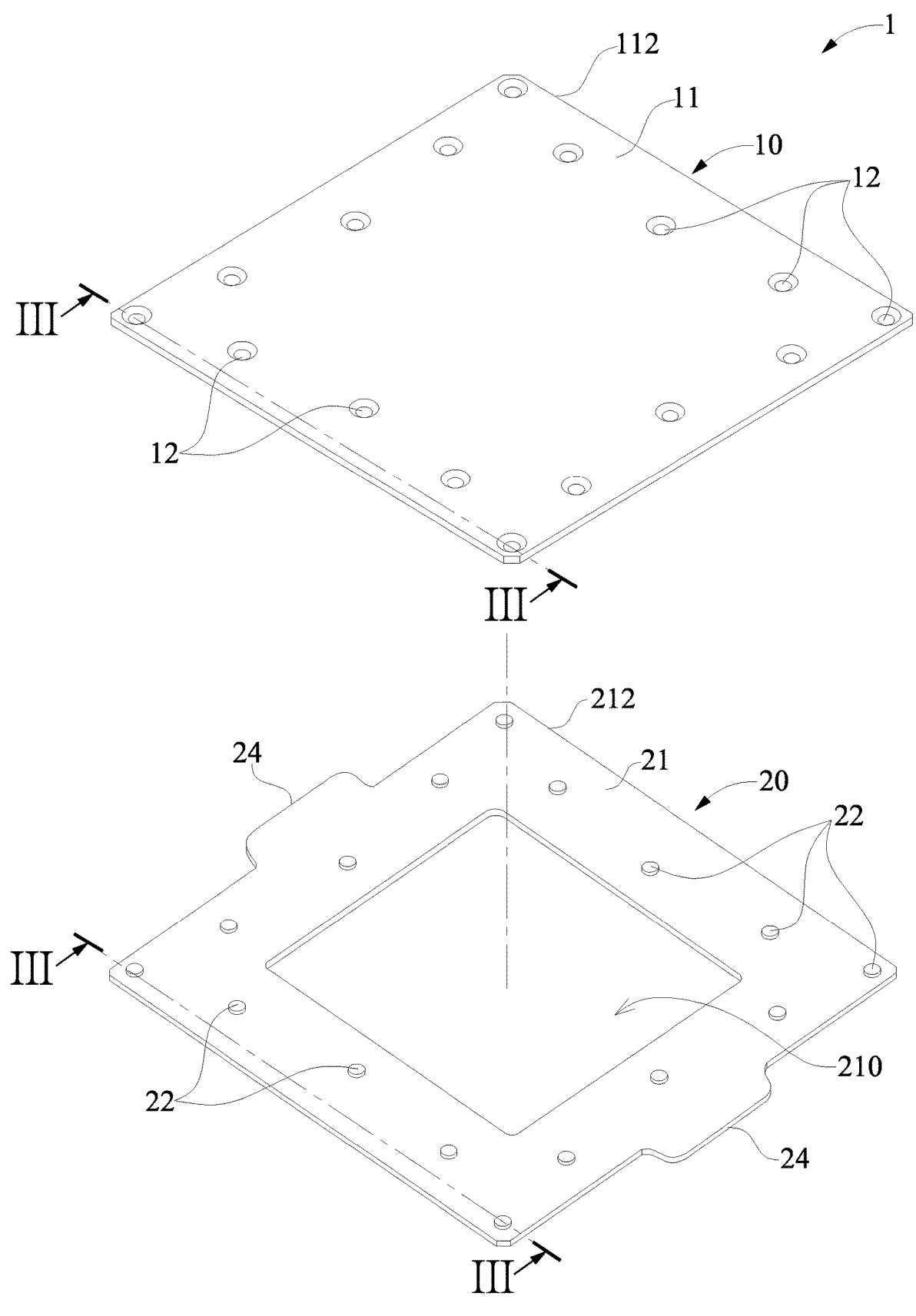
FIG. 1 is a perspective exploded view of a compound closed-type metal lid for a semiconductor chip package according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, an embodiment of the present disclosure provides a compound closed-type metal lid for a semiconductor chip package 1, or to be referred as a compound closed-type metal lid hereinafter, which includes a cover plate 10 and a frame bottom board 20.

The cover plate 10 has a plate body 11, and a plurality of riveting holes 12. The riveting holes 12 penetrate through the plate body 11 and are distributed symmetrically on the plate body 11.

The frame bottom board 20 has a frame body 21, a plurality of riveting protrusions 22, and an opening 210. The riveting protrusions 22 are distributed on an upper surface of the frame body 21. The opening 210 penetrates through and is formed in an inner area of the frame body 21. The opening 210 is rectangular-shaped. The cover plate 10 is disposed on the upper surface of the frame bottom board 20. The riveting protrusions 22 of the frame bottom board 20 are riveted correspondingly in the riveting holes 12 of the cover plate 10.

In the compound closed-type metal lid 1 of this embodiment, preferably, a material of the cover plate 10 is different from that of the frame bottom board 20. For example, the cover plate 10 is made of copper alloy or ceramic, and the frame bottom board 20 is made of stainless steel. The stainless steel can increase the overall structural strength of the compound metal lid 1, and the copper alloy can increase the heat-dissipation and heat-conduction effects. However, the present disclosure is not limited thereto, and the material of the cover plate 10 can be the same as that of the frame bottom board 20.

The quantity of the riveting holes 12 is equal to that of the riveting protrusions 22. Preferably, the positions of the riveting holes 12 are symmetrically distributed at two sides of any one of the diagonal lines of the plate body 11. From another viewing angle, the positions of the riveting holes 12 are symmetrically distributed at two sides of a central normal line of any side edge of the plate body 11. Taking the frame bottom board 20 as an example, along the diagonal line X1 of the frame bottom board 20 in FIG. 1, the positions and quantities of the riveting protrusions 22 at two sides of the diagonal line X1 are symmetric. Therefore, after an assembly process, the stress of the compound closed-type metal lid 1 may be distributed symmetrically.

The length of the cover plate 10 is smaller than that of the frame bottom board 20, the width of the cover plate 10 is smaller than that of the frame bottom board 20, and the area of the cover plate 10 is larger than that of the opening 210. In other words, the cover plate 10 fully covers the opening 210. An outer edge 112 of the cover plate 10 is not aligned to the outer edge 212 of the frame bottom board 20.

Such structure could be beneficial in strengthening the overall structural strength of the compound closed-type metal lid 1 and increasing the flatness to avoid warping deformation. However, the present disclosure is not limited thereto.

The frame body 21 has four side frames that have identical widths. The riveting protrusions 22 are distributed on each side frame of the frame body 21 along different straight lines. In other words, as shown in FIG. 1, the riveting protrusions 22 are not distributed on the same straight line on the side frames of the frame body 21, so as to facilitate a dispersion of stress when the frame bottom board 20 is riveted to the cover plate 10.

Figure 2:
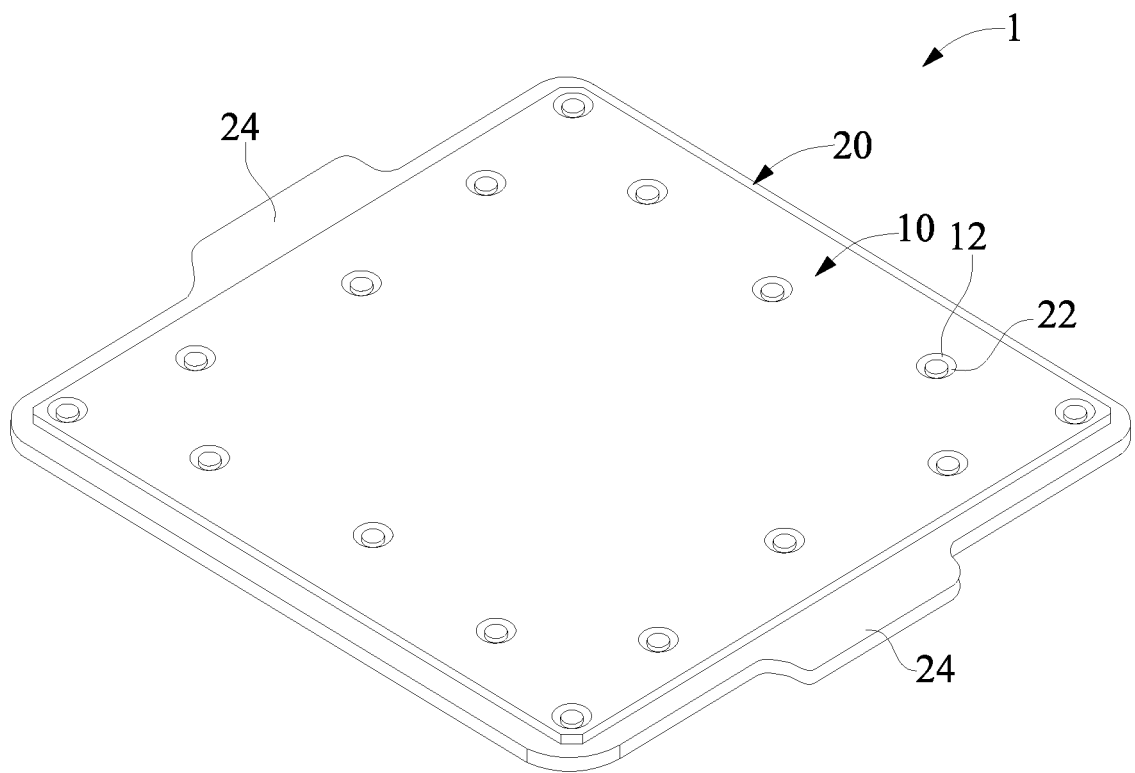
FIG. 2 is a perspective assembled view of the compound closed-type metal lid according to the present disclosure.

As shown in FIG. 1 and FIG. 2, two sides of the frame bottom board 20 each have an extension tab 24, respectively. The extension tabs 24 extend outward from the outer edges of the frame body 21.

Figure 3:
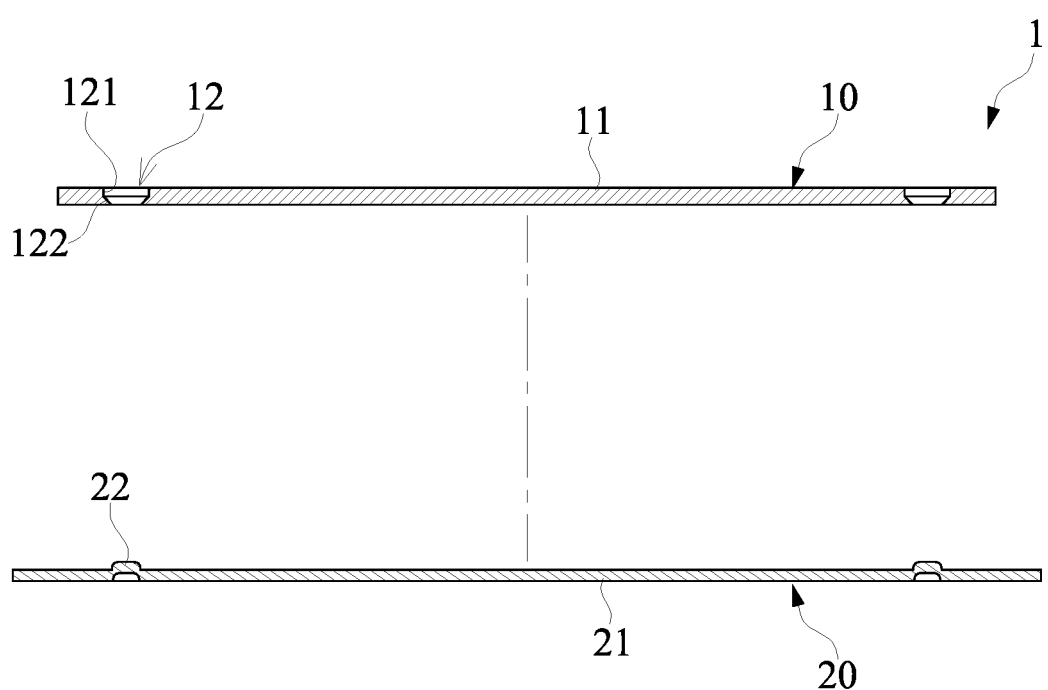
FIG. 3 is a cross-sectional view taken along line III-III of FIG. 1.
Figure 4:
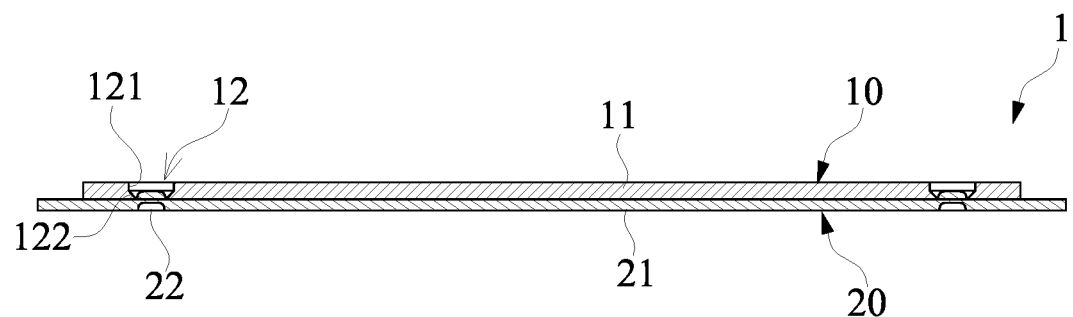
FIG. 4 is a cross-sectional view of the compound closed-type metal lid before riveting according to the present disclosure.
Figure 5:
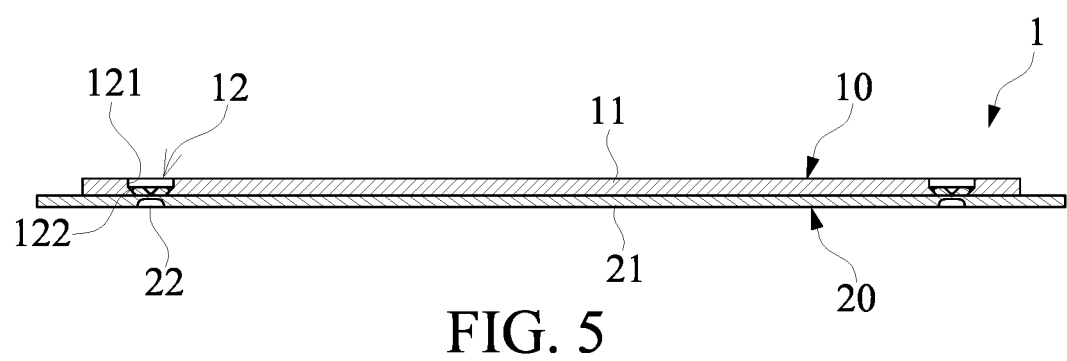
FIG. 5 is a cross-sectional view of the compound closed-type metal lid after riveting according to the present disclosure.

Reference is made to FIG. 3 to FIG. 5. Each riveting hole 12 has an upper half-hole 121 and a lower half-hole 122 which is spatially communicated to the upper half-hole 121. The upper half-hole 121 has a diameter identical throughout the upper half-hole 121 and is shaped in a hollow cylinder. The lower half-hole 122 gradually tapers downward from the upper half-hole 121 and is substantially cone-shaped. The riveting protrusions 22 are cylinder-shaped and have diameters identical throughout the riveting protrusions 22. The diameter of the riveting protrusions 22 is smaller than or equal to a minimum diameter of the lower half-hole 122. As shown in FIG. 3, after the cover plate 10 and the frame bottom board 20 are stacked with each other, before a riveting process, a height of the riveting protrusion 22 is substantially equal to a height of the lower half-hole 122, and the riveting protrusion 22 does not rise beyond the top surface of the plate body 11.

As shown in FIG. 5, during the riveting process, a pointed tip hammer is used to hammer a central portion of a top surface of the riveting protrusion 22. The riveting protrusion 22 concaves downward from a center of the top surface and extends outward, and becomes substantially bowl-shaped. An outer edge of the riveting protrusion 22 is extended to contact a periphery of the lower half-hole 122. Therefore, the riveting protrusions 22 are correspondingly riveted in the riveting holes 12.

Furthermore, a range of a taper angle of the lower half-hole 122 is between 16 degrees and 60 degrees, and preferably between 36 degrees and 60 degrees. In addition, the riveting holes 12 can be substantially cone-shaped and taper gradually from a top surface to a bottom surface of the plate body 11.

Figure 6:
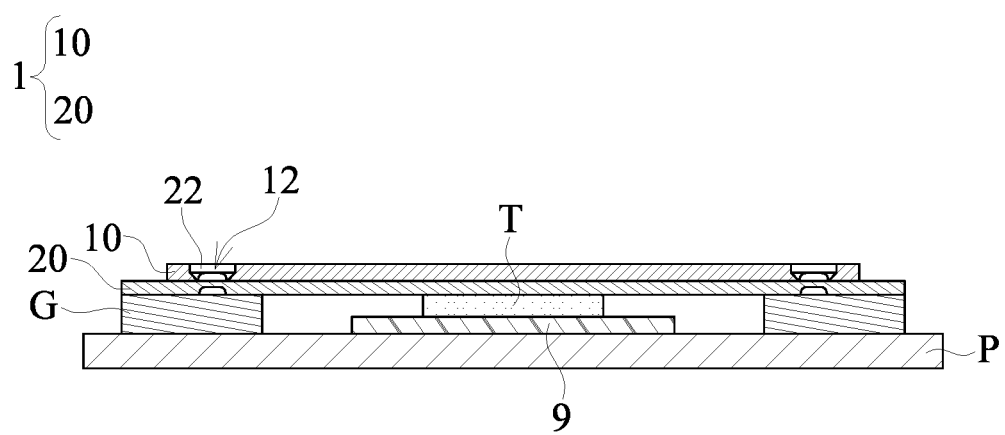
FIG. 6 is a cross-sectional view of the compound closed-type metal lid assembled to a semiconductor chip package structure according to the present disclosure.

As shown in FIG. 6, which is a schematic cross-sectional view of the compound closed-type metal lid assembled to a semiconductor chip package. The compound closed-type metal lid 1 covers on a semiconductor chip 9, and is attached to the semiconductor chip 9 by thermal paste T. The semiconductor chip 9 is disposed on a top surface of a substrate P. The frame bottom board 20 of the compound closed-type metal lid 1 is attached to the substrate P by glue G.

BENEFICIAL EFFECTS OF THE EMBODIMENT

In conclusion, the present disclosure has at least one beneficial effect that, by disposing the cover plate on the upper surface of the frame bottom board, and correspondingly riveting the riveting protrusions in the riveting holes, the compound closed-type metal lid for the semiconductor chip package can be applied to a large-sized semiconductor chip and its substrate, such that the total structural strength of the substrate is increased. Furthermore, the substrate is prevented from the warping issue, and the heat-dissipation function of the semiconductor chip is enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A compound closed-type metal lid for a semiconductor chip package, comprising:
    a cover plate including a plate body, and a plurality of riveting holes, wherein the plurality of riveting holes penetrate through the plate body and are symmetrically distributed on the plate body; and
    a frame bottom board including a frame body, a plurality of riveting protrusions, and an opening, wherein the plurality of riveting protrusions are distributed on an upper surface of the frame body;
    wherein the cover plate is disposed on the upper surface of the frame bottom board, and the plurality of the riveting protrusions are correspondingly riveted in the plurality of the riveting holes;
    wherein each of the riveting holes has an upper half-hole and a lower half-hole communicated spatially to the upper half-hole, the upper half-hole has a diameter identical throughout the upper half-hole, the lower half-hole gradually tapers downward from the upper half-hole, the riveting protrusions are cylinder-shaped and each has a diameter identical throughout the riveting protrusion in a state of not being riveted, and a diameter of each of the riveting protrusions is smaller or equal to a minimum diameter of any of the lower half-holes;
    wherein a range of a taper angle of the lower half-hole is between 16 degrees and 60 degrees.

2. The compound closed-type metal lid according to claim 1, wherein a material of the cover plate is different from a material of the frame bottom board.

3. The compound closed-type metal lid according to claim 2, wherein the cover plate is made of copper alloy or ceramic, and the frame bottom board is made of stainless steel.

4. The compound closed-type metal lid according to claim 1, wherein a length of the cover plate is smaller than that of the frame bottom board, a width of the cover plate is smaller than that of the frame bottom board, and an area of the cover plate is larger than that of the opening.

5. The compound closed-type metal lid according to claim 1, wherein two sides of the frame bottom board each have an extension tab, and the extension tabs extend outward from outer edges of the frame body.

6. The compound closed-type metal lid according to claim 1, wherein a quantity of the plurality of riveting holes is equal to a quantity of the plurality of riveting protrusions, and positions of the plurality of riveting holes are distributed symmetrically at two sides of any one of diagonal lines of the plate body.

7. The compound closed-type metal lid according to claim 1, wherein a quantity of the plurality of riveting holes is equal to a quantity of the plurality of riveting protrusions, and positions of the plurality of riveting holes are symmetrically distributed at two sides of a central normal line of any side edge of the plate body.

* * * * *